United States Patent
Barash et al.

(10) Patent No.: US 10,241,502 B2
(45) Date of Patent: Mar. 26, 2019

(54) METHODS OF ERROR DETECTION IN FABRICATION PROCESSES

(71) Applicant: GLOBALFOUNDRIES Inc., Grand Cayman (KY)

(72) Inventors: Eugene Barash, Niskayuna, NY (US); James Broc Stirton, Galway, NY (US); Richard Good, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 289 days.

(21) Appl. No.: 15/374,453

(22) Filed: Dec. 9, 2016

(65) Prior Publication Data
US 2017/0097635 A1 Apr. 6, 2017

Related U.S. Application Data

(63) Continuation-in-part of application No. 15/258,217, filed on Sep. 7, 2016.
(Continued)

(51) Int. Cl.
*H01L 21/00* (2006.01)
*G05B 19/418* (2006.01)
(Continued)

(52) U.S. Cl.
CPC ... *G05B 19/41875* (2013.01); *G03F 7/70533* (2013.01); *G03F 7/70616* (2013.01);
(Continued)

(58) Field of Classification Search
None
See application file for complete search history.

(56) References Cited

U.S. PATENT DOCUMENTS

| | | | |
|---|---|---|---|
| 6,303,395 B1 | 10/2001 | Nulman | |
| 8,103,478 B2 * | 1/2012 | Good | G06K 9/6247 438/14 |

(Continued)

FOREIGN PATENT DOCUMENTS

| | | |
|---|---|---|
| TW | 200408919 A | 6/2004 |
| TW | 200947251 A | 11/2009 |
| TW | 201039070 A | 11/2010 |

OTHER PUBLICATIONS

S. Bersimis et al., "Multivariate Statistical Process Control Charts: An Overview", MPRA Paper No. 6399, posted Dec. 20, 2007.
(Continued)

*Primary Examiner* — Benjamin P Sandvik
(74) *Attorney, Agent, or Firm* — Thompson Hine LLP; Francois Pagette

(57) ABSTRACT

Methods and computer program products for performing automatically determining when to shut down a fabrication tool, such as a semiconductor wafer fabrication tool, are provided herein. The methods include, for example, creating a measurement vector including process parameters of semiconductor wafers, creating a correlation matrix of correlations between measurements of parameters obtained of each wafer, creating autocorrelation matrixes including correlations between measurements of the parameter obtained for pairs of wafers; creating a combined matrix of correlation and autocorrelation matrixes, obtaining a $T^2$ value from the measurement vector and combined matrix, and stopping a semiconductor wafer fabrication tool if the $T^2$ value exceeds a critical value.

20 Claims, 12 Drawing Sheets

Related U.S. Application Data

(60) Provisional application No. 62/235,889, filed on Oct. 1, 2015.

(51) Int. Cl.
  *H01L 21/66* (2006.01)
  *H01L 21/67* (2006.01)
  *G03F 7/20* (2006.01)

(52) U.S. Cl.
  CPC ........ *H01L 21/67242* (2013.01); *H01L 22/20* (2013.01); *H01L 22/26* (2013.01); *G05B 2219/45031* (2013.01); *Y02P 90/22* (2015.11)

(56) References Cited

U.S. PATENT DOCUMENTS

| | | | |
|---|---|---|---|
| 9,929,062 B2* | 3/2018 | Matsushita | ........ G05B 23/0283 |
| 2012/0150489 A1 | 6/2012 | Dhurandhar et al. | |
| 2014/0135968 A1 | 5/2014 | Lee et al. | |
| 2016/0063157 A1 | 3/2016 | Huang et al. | |

OTHER PUBLICATIONS

Nelson Rules, Oct. 1984, https://en.wikipedia.org/wiki/Nelson_rules, last viewed on Dec. 9, 2016.

Taiwan Patent Office, Examination Report from the Intellectual Property Office for TW Application 105131175 dated Jul. 25, 2017, 13 pages.

* cited by examiner

METHODS OF ERROR DETECTION IN FABRICATION PROCESSES

CROSS-REFERENCE TO RELATED APPLICATIONS

This application is a continuation-in-part of U.S. Non-Provisional patent application Ser. No. 15/258,217, which was filed on Sep. 7, 2016, and claims the benefit of U.S. Provisional Patent Application No. 62/235,889, filed on Oct. 1, 2015.

FIELD OF THE INVENTION

The present invention relates to error detection in fabrication processes, and more particularly, to Statistical Process Control methods for detecting semiconductor fabrication errors and automatically determining when to stop a fabrication tool.

BACKGROUND OF THE INVENTION

Manufacturing of integrated circuits on semiconductor wafers may involve numerous stages of fabrication and processing, and may thus require several processes control steps for detecting fabrication errors. When significant fabrication errors are found on a wafer or a batch of wafers, such that the wafers are defective and unusable, fabrication tools may need to be shut down and adjusted or fixed to prevent further fabrication of wafers with such significant errors. However, many techniques for detecting fabrication errors have a high "false alarm" rate, causing fabrication tools to be needlessly stopped and wasting valuable manufacturing and engineering time, as well as greatly reducing productivity and wafer yield.

SUMMARY OF THE INVENTION

Various shortcomings of the prior art are overcome, and additional advantages are provided through the provision, in one aspect, of a method for stopping semiconductor fabrication, including creating a measurement vector including a measurement of each of one or more parameters from each of one or more semiconductor wafers; for each of the one or more semiconductor wafers, creating a correlation matrix, wherein the correlation matrix includes correlations between measurements of parameters obtained of each said wafer; for each pair of the one or more semiconductors for which a measurement of a parameter has been obtained from each semiconductor wafer of the pair, creating an autocorrelation matrix, wherein the autocorrelation matrix includes correlations between measurements of the parameter obtained of each wafer of the pair; creating a combined matrix, wherein creating includes combining correlation and autocorrelation matrixes into a combined matrix; obtaining a $T^2$ value from the measurement vector and combined matrix; and stopping a semiconductor wafer fabrication tool if the $T^2$ value exceeds a critical value.

In some embodiments, the confidence value is greater than 95%, greater than 97.5%, or greater than 99%. In other embodiments, the measurement vector, the correlation matrix, the autocorrelation matrix, the combined matrix, the $T^2$ value, or any combination of two or more of the foregoing, is created, constructed, or obtained by a computer. In yet other embodiments, a computer stops the semiconductor wafer fabrication tool if a $T^2$ value is obtained that exceeds a critical value.

In another aspect, provided is method for stopping semiconductor fabrication, including creating a measurement vector including a measurement of each of one or more parameters from each of one or more semiconductor wafers; for each of the one or more semiconductor wafers, creating a correlation matrix, wherein the correlation matrix includes correlations between measurements of parameters obtained of each said wafer; for each pair of the one or more semiconductors for which a measurement of a parameter has been obtained from each semiconductor wafer of the pair, create an autocorrelation matrix, wherein the autocorrelation matrix includes correlations between measurements of the parameter obtained of each wafer of the pair; creating a combined matrix, wherein creating includes combining correlation and autocorrelation matrixes into a combined matrix; obtaining a $T^2$ value from the measurement vector and combined matrix; wherein the measurement vector, the correlation matrix, the autocorrelation matrix, the combined matrix, the $T^2$ value, or any combination of two or more of the foregoing, is created, constructed, or obtained by a computer; and stopping a semiconductor wafer fabrication tool if the $T^2$ value exceeds a chi-square distribution value ($\chi^2$) includes a degrees of freedom value and a preselected confidence value and the degrees of freedom value is the number of measurements in the measurement vector and the preselected confidence value is greater than 95%.

In some embodiments, the preselected confidence interval is greater than 95%, greater than 97.5%, or greater that 99%. In other embodiments, a computer stops the semiconductor wafer fabrication tool if the $T^2$ value exceeds the critical value.

In yet a further aspect, provided is a method for stopping semiconductor fabrication, including creating a measurement vector including a measurement of each of one or more parameters from each of one or more semiconductor wafers; for each of the one or more semiconductor wafers, creating a correlation matrix, wherein the correlation matrix includes correlations between measurements of parameters obtained of each said wafer; for each pair of the one or more semiconductors for which a measurement of a parameter has been obtained from each semiconductor wafer of the pair, creating an autocorrelation matrix, wherein the autocorrelation matrix includes correlations between measurements of the parameter obtained of each wafer of the pair; creating a combined matrix, wherein creating includes combining correlation and autocorrelation matrixes into a combined matrix; obtaining a $T^2$ value from the measurement vector and combined matrix; wherein the measurement vector, the correlation matrix, the autocorrelation matrix, the combined matrix, the $T^2$ value, or any combination of two or more of the foregoing, is created, constructed, or obtained by a computer; and stopping a semiconductor wafer fabrication tool if the $T^2$ value exceeds a chi-square distribution value including a degrees of freedom value and a preselected confidence value and the degrees of freedom value is the number of measurements in the measurement vector and the preselected confidence value is greater than 95%, wherein a computer stops the semiconductor wafer fabrication tool.

In some embodiments, the preselected confidence interval is greater than 97.5% or greater than 99%. In other embodiments, provided is a computer-readable medium containing a program code for creating the measurement vector, creating the correlation matrix, creating the autocorrelation matrix, creating the combined matrix, creating the $T^2$ value, stopping semiconductor wafer fabrication, or any combination of two or more of the foregoing, in accordance with the provided method.

In another aspect, a method for stopping semiconductor fabrication is provided, including obtaining a plurality of sets of measurements wherein each set of measurements includes a measurement of each of one or more parameters from each of one or more semiconductor wafers; for a set of measurements, creating a measurement vector, creating one or more correlation matrixes that include correlations between measurements of parameters of a semiconductor wafer, creating one or more autocorrelation matrixes that include correlations of a parameter between a pair of the one or more semiconductor wafers, creating a combined matrix by combining the one or more correlation matrixes and the one or more autocorrelation matrixes, obtaining a $T^2$ value from the measurement vector and the combined matrix, obtaining a chi-square distribution value with a degrees of freedom value and a preselected confidence value wherein the degrees of freedom value includes the number of measurements in the measurement vector, and creating a figure of merit wherein the figure of merit is the square root of the ratio of the $T^2$ value to the chi-square distribution value; and stopping a semiconductor wafer fabrication tool if a figure of merit from one or more measurement sets exceeds a critical value.

In some embodiments, a figure of merit from one or more measurement sets exceeds a critical value when the figure of merit for each of five, six, or seven consecutive measurement sets is greater than the figure of merit for the immediately previous measurement set. In another embodiment, a figure of merit from one or more measurement sets exceeds a critical value when the figure of merit for each of six consecutive measurement sets is greater than the figure of merit for the immediately previous measurement set. In a still further embodiment, a figure of merit from one or more measurement sets exceeds a critical value when the figures of merit for fourteen consecutive measurement sets alternate between being higher than and lower than the figure of merit for the immediately preceding measurement set. In another embodiment, a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

In another aspect, a method for stopping semiconductor fabrication is provided, including obtaining a plurality of sets of measurements wherein each set of measurements includes a measurement of each of one or more parameters from each of one or more semiconductor wafers; for a set of measurements, creating a measurement vector, creating one or more correlation matrixes that include correlations between measurements of parameters of a semiconductor wafer, creating one or more autocorrelation matrixes that include correlations of a parameter between a pair of the one or more semiconductor wafers, creating a combined matrix by combining the one or more correlation matrixes and the one or more autocorrelation matrixes, and obtaining a $T^2$ value from the measurement vector and the combined matrix, obtaining a probability value including the probability of obtaining a chi-square value with a degrees of freedom value including the number of measurements in the measurement vector wherein the chi-square value is the $T^2$ value, and obtaining a sigma coefficient value of a univariate normal distribution corresponding to the probability; and stopping a semiconductor wafer fabrication tool if a sigma coefficient value from one or more measurement sets exceeds a critical value.

In one embodiment, a sigma coefficient value from one or more measurement sets exceeds a critical value when the sigma coefficient values for each of two or more out of three consecutive measurement sets or each of four or more out of six consecutive measurement sets or each of six or more out of nine consecutive measurement sets is greater than two. In another embodiment, a sigma coefficient value from one or more measurement sets exceeds a critical value when the sigma coefficient value for each of two or more out of three consecutive measurement sets is greater than two. In yet another embodiment, a sigma coefficient value from one or more measurement sets exceeds a critical value when the sigma coefficient values for four or more out of five consecutive measurement sets exceed one. In yet another embodiment, a sigma coefficient value from one or more measurement sets exceeds a critical value when the sigma coefficient value for each of fourteen, fifteen, or sixteen consecutive measurement sets is between zero and one.

In another embodiment, a sigma coefficient value from one or more measurement sets exceeds a critical value when the sigma coefficient value for each of fifteen consecutive measurement sets is between zero and one. In another embodiment, a sigma coefficient value from one or more measurement sets exceeds a critical value when the sigma coefficient value for each of seven, eight, or nine consecutive measurement sets is greater than one. In yet another embodiment, a sigma coefficient value from one or more measurement sets exceeds a critical value when the sigma coefficient values for each of eight consecutive measurement sets is greater than one. In another embodiment, a measurement vector, a correlation matrix, an autocorrelation matrix, a combined matrix, a $T^2$ value, a chi-square distribution value, a probability value, a sigma coefficient, or any combination of two or more of the foregoing, is created, constructed, or obtained by a computer.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
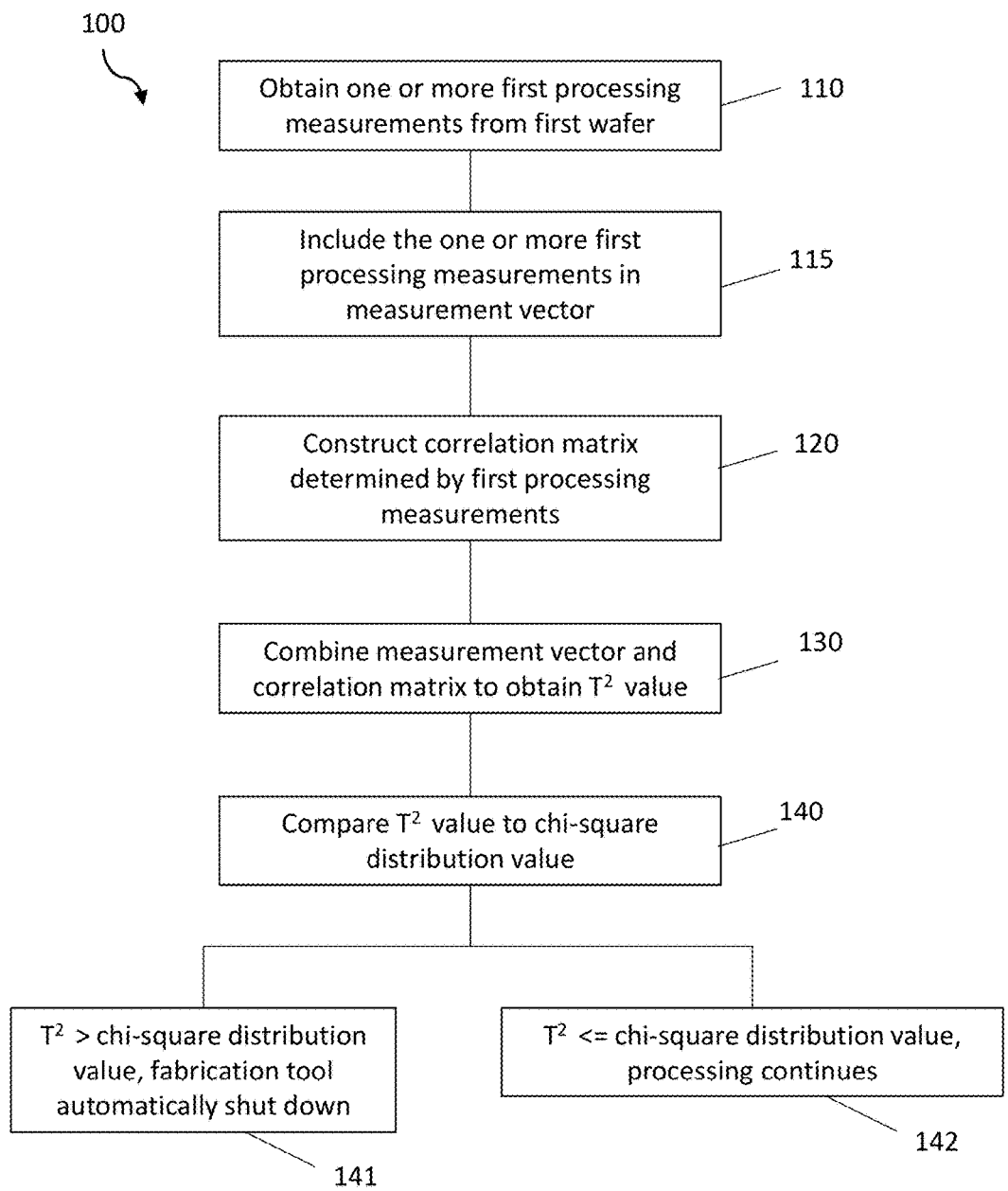
FIG. 1A is a block diagram depicting one embodiment of a process for determining when to stop a fabrication tool.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Note also that reference is made below to the drawings, which are not drawn to scale for ease of understanding, wherein the same reference numbers used throughout different figures designate the same or similar components. For the sake of clarity, only those elements and reference characters which are of relevance to the shown aspects of the respective embodiment of the present invention are shown repeatedly. In this regard, no attempt is made to show structural details of the invention in more detail than is necessary for a fundamental understanding of the invention, the description taken with the drawings making apparent to those skilled in the art how the several forms of the invention may be embodied in practice.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

Statistical Process Control (SPC) may be used throughout semiconductor wafer manufacturing processes to identify when fabrication processes have changed from normal operation, that is, a process and/or tool has begun to go out of control. SPC processes generally take one or more measurements of a wafer, such as wafer thickness or a critical dimension (CD) of a layer, and compare those measurements to statistical or normal averages to identify significant deviations from normal. SPC may be used to detect when a fabrication process has disadvantageously changed from normal operation (i.e., an out-of-control violation has occurred or is occurring) and then interrupt, such as automatically, a fabrication process by inhibiting: in a part of equipment such as a chamber, a recipe, or sequence of one or more steps, where the part or recipe may be responsible for the out-of-control processing; more than one or all of the recipes in one or more parts of equipment; an entire tool; or multiple or all tools that run a given fabrication process or processes. This could include immediate shut down, or restriction of a production path of a selected product while other products may continue to be fabricated of the same equipment, for example. Consequently, fabrication equipment may be shut down (such as powered down, etc) to undergo some maintenance or reconditioning according to fabrication operating procedure.

Many SPC processes set a control limit of three-sigma ($3\sigma$), or three standard deviations, from normal as a limit for detecting significant errors. Measurements that deviate three standard deviations or more from normal are rare enough that such measurements would indicate that a process has changed significantly and may be running out of control. When applied to single wafer samples, SPC processes may produce a "false alarm" rate of about 1% or less. However, in many advanced semiconductor wafer fabrication processes, measurements are not only taken from a single wafer, but multiple wafers may be sampled from a batch of wafers, and multiple parameters may be measured on different wafers. In addition, some parameters may be measured for some wafers within a batch while different parameters are measured for other wafers within the same batch. Without proper correlation between wafers or correlation between parameters, the false alarm rate may increase to 16.5% or more, as the odds of any single parameter measurement falling outside the three-sigma control limit increases as more parameters are measured. As more parameters are added with increased reduction in integrated circuit feature sizes, the false alarm rate may increase even further. Every false alarm potentially shuts down a fabrication tool that is operating within normal parameters and producing usable and acceptable wafers, wasting manufacturing time and wasting technicians' time trying to diagnose a non-existent fault.

Multivariate analysis processes are statistical analysis methods that may correlate multiple parameters to more accurately determine when a significant error in manufacturing has occurred. Multivariate analysis processes, in general, involve constructing a vector of measured parameters and correlating those measurements against a constructed matrix of correlation values between pairs of parameters. The resulting calculation is compared against an expected deviation value based on the number of parameters being measured; if the calculation is less than or equal to this expected deviation value, then the manufacturing process or processes are considered to be operating within acceptable parameters. Thus, even if one or two measurements fall outside the three-sigma control limit, the full vector of measurements may not fall outside the three-sigma control limit, and thus a much lower rate of false alarms may arise.

However, multivariate analyses generally require that all measurements of the vector be available at once; that is, the error analysis cannot be conducted unless all of the parameters to be measured and correlated have actually been measured. If certain values are unavailable to complete the vector, then the analysis cannot proceed. This alone makes multivariate analysis difficult or impossible for SPC processes, as data from sampled wafers generally is not available all at once because no single metrology tool may measure all of the necessary parameters. In addition, sampled wafers may not undergo metrology for a particular processing step for hours or even days after the processing step is finished for those wafers. Thus, while wafers with potentially significant errors are waiting to be measured, more wafers may be produced with the same significant errors, potentially wasting money, materials, and manufacturing time.

Further, multivariate analyses may generally require that the parameters measured be consistent across all sampled wafers, as the correlation matrix generally includes correlations between all possible combinations of parameters. In practice, however, it is not feasible to measure the same parameters consistently across a consistent sample of wafers. Generally, some parameters like thickness may be measured for one sub-set of sampled wafers, other parameters such as a particular critical dimension may be measured for a different sub-set of sample wafers, making the parameters measured inconsistent across wafers. Thus, using ordinary multivariate analysis processes may be inadequate for automatically determining whether a fabrication tool should be shut down. By the time all the variables necessary to complete the measurement vector are available and can be used to determine that a fabrication tool is operating out of control, many dozens or hundreds of additional wafers may have been processed by the same out of control fabrication tool.

FIG. 1A is a block diagram depicting one embodiment of a process 100 for automatically determining when to shut down a fabrication tool. At block 110, one or more first processing measurements are obtained from a first wafer. The first processing measurements, at block 115, are included in a measurement vector. At block 120, a correlation matrix is constructed. The correlation matrix includes correlation values determined by the first processing measurements obtained from the first wafer. At block 130, the measurement vector and correlation matrix are combined to determine a $T^2$ value. The $T^2$ value is compared, at block 140, to a chi-square distribution value, where the chi-square distribution value is determined by the number of first processing measurements made and a pre-selected confidence value. If the $T^2$ value is greater than the chi-square distribution value, then at block 141 a significant processing error is detected, and the fabrication tool is automatically shut down. If the $T^2$ value is less than or equal to the chi-square distribution value, then at block 142 processing continues.

Figure 1B:
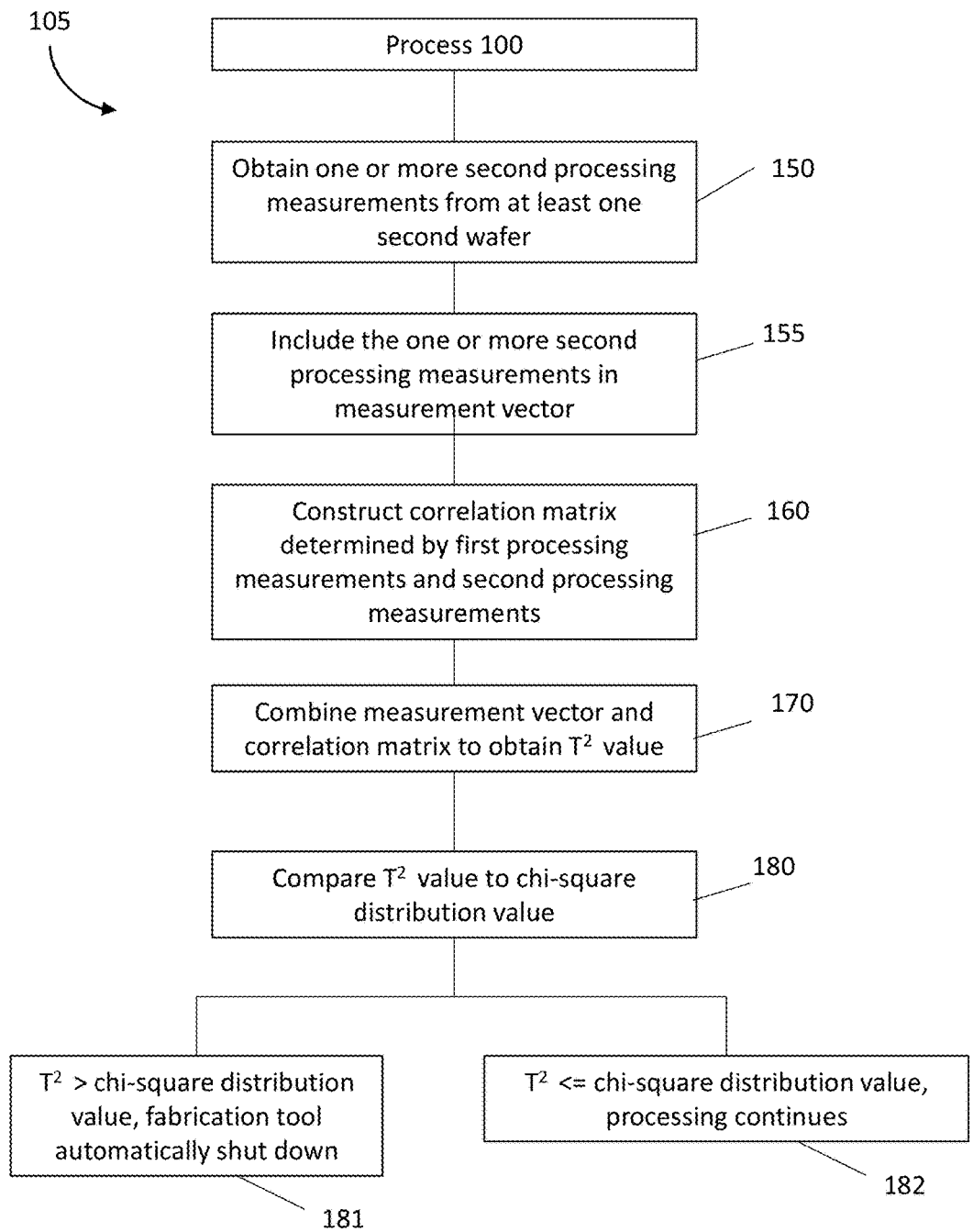
FIG. 1B is a block diagram depicting an additional embodiment of a process for determining when to stop a fabrication tool.

FIG. 1B is a block diagram depicting at least one embodiment of additional processing 105 following the process 100 of FIG. 1B. At block 150, one or more second processing measurements are obtained from at least one second wafer. The second processing measurements, at block 155, are included in the measurement vector. At block 160, the correlation matrix is updated using the second processing measurements. At block 170, the measurement vector and correlation matrix are combined to determine a $T^2$ value. The $T^2$ value is compared, at block 180, to a chi-square distribution value, where the chi-square distribution value is determined by the number of first processing measurements and second processing measurements made and the pre-selected confidence value. If the $T^2$ value is greater than the chi-square distribution value, then at block 181 a significant processing error is detected, and the fabrication tool is automatically shut down. If the $T^2$ value is less than or equal to the chi-square distribution value, then at block 182 processing continues.

Multivariate analysis processes generally make use of what may be commonly referred to as the $T^2$ value or $T^2$ statistic. The $T^2$ value or statistic is determined by:

$$T^2 = x^T R^{-1} x \tag{1}$$

where x is a vector of measurements and R is a matrix of correlation values between measurements. In application to semiconductor wafer processing, the measurements of the vector x may include thickness, one or more critical dimensions, and/or other wafer parameters that may be measured.

The matrix R generally includes matrix values that represent correlations between different measurements. In general, the more highly related two parameters of a wafer are, the higher the respective correlation value in the matrix R will be for those two parameters. As an example, suppose that the parameters measured for the vector x include a wafer thickness Thk, a first critical dimension CD1, a second critical dimension CD2, and a third critical dimension CD3, so that x expressed in vector form is:

$$x = [Thk, CD1, CD3, CD2]. \tag{2}$$

The corresponding correlation matrix R would contain values that correlate thickness to CD1, thickness to CD2, CD1 to CD2, and so on. The more closely related two parameters are to each other, the higher their correlation value in the matrix R. For example, the thickness of a wafer may not be highly related to a first critical dimension CD1, such as a fin size or gate size; that is, whether the measured critical dimension CD1 falls outside an acceptable range may be unrelated to whether the measured thickness of the wafer Thk falls outside an acceptable range of thickness values. Thus, a correlation value between thickness Thk and critical dimension CD1 may be very low, such as about 0.15. A different critical dimension, such as CD3, may be highly related to the thickness due to the effects of processing a layer where critical dimension CD3 is measured. Thus, a correlation value between thickness Thk and critical dimension CD3 may be relatively high, such as about 0.74. The correlation between a parameter and itself, for the purpose of constructing matrix R, is always 1. Thus, for the example vector x above, the corresponding correlation matrix R might be:

$$R = \begin{bmatrix} 1 & 0.15 & 0.74 & 0.01 \\ 0.15 & 1 & 0.1 & 0.1 \\ 0.74 & 0.03 & 1 & 0.03 \\ 0.01 & 0.1 & 0.03 & 1 \end{bmatrix} \begin{matrix} Thk \\ CD1 \\ CD3 \\ CD2 \end{matrix} \quad (3)$$

$$\begin{matrix} Thk & CD1 & CD3 & CD2 \end{matrix}$$

The $T^2$ value or statistic is compared to a chi-square distribution value as below:

$$T^2 = x^T R^{-1} x \leq \chi^{-2}(\alpha, n) \tag{4}$$

where $\alpha$ is a pre-set confidence limit and n is the number of measurements. The confidence limit $\alpha$ may itself be determined, in part, by the number of measurements n. If the $T^2$ value is less than or equal to the value of $\chi^{-2}$ then the vector of measurements x may be determined to fall within normal or acceptable parameters, even if any one or more of the individual measurements in x falls outside an acceptable range, such as a value three standard deviations (or more) higher or lower than a normal or average value.

The general multivariate analysis process described above, however, may not account for different parameters measured across different wafers of a batch, nor does it account for common situations in which certain parameter measurements may be unavailable or delayed. To account for these situations, both the measurement vector x and the correlation matrix R may be constructed "on the fly" as data becomes available, as described in FIGS. 1A and 1B above and further below. The processes described below allow for correlating parameters measured within the same wafer separately from correlating parameters between different wafers, and then constructing an overall correlation matrix R, so that the multivariate analysis may be carried out even in the absence of particular measurements and even in situations in which different parameters are measured across different wafers within a wafer batch.

In the processes described above and as exemplified in the example process described below, two correlation matrices $R_1$ and $R_2$ may be constructed to determine an overall correlation matrix R that may be used in equation (1) above. $R_1$ is a correlation matrix for parameters measured on the same wafer, such as thickness of the wafer correlated to a first critical dimension, thickness correlated to a second critical dimension, the first critical dimension correlated to the second critical dimension, and so on. $R_2$ is a correlation matrix for similar parameters measured between wafers (referred to as an autocorrelation matrix), such as the thickness of a first wafer correlated to the thickness of a second wafer, a first critical dimension of the first wafer correlated to the thickness of the second wafer, and so on. In general, different parameters measured on the same wafer will have some value of correlation between 0 and 1, and the same parameter measured on two different wafers will also have some value of correlation between 0 and 1, but it may generally be assumed that the correlation between two different parameters measured on two different wafers is zero (e.g., it may be assumed that there is no correlation between the thickness of one wafer and a measured critical dimension of a second wafer, for example).

The values for correlation matrices $R_1$ and $R_2$ may generally correspond to statistical norms or averages, which may be determined, for example, through empirical measurement and correlation of different parameters for wafers. These statistical norms may be determined both for correlations between parameters on single wafers and for correlations between parameters on different wafers.

Figure 2A:
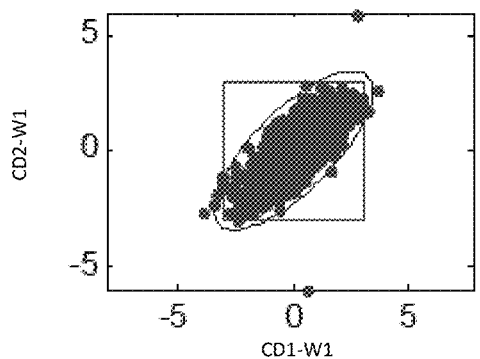
FIG. 2A, FIG. 2B, and FIG. 2C depict a portion of an embodiment for constructing a correlation matrix.
Figure 2B:
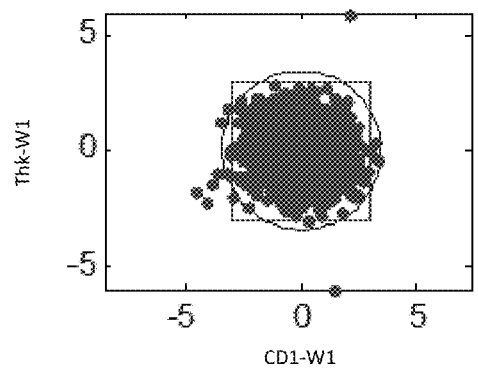
Figure 2C:
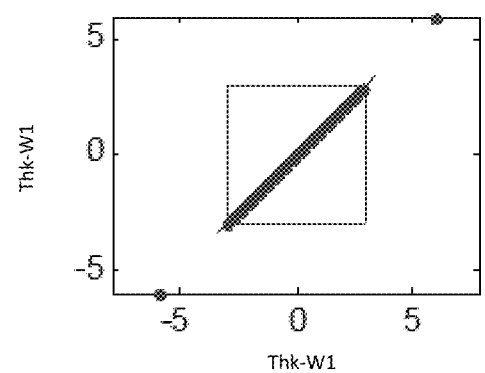

One example method for determining correlation values for matrix $R_1$ is illustrated in part by FIGS. 2A-2C.

FIG. 2A, for example, is a graph depicting correlations between a first critical dimension CD1 and a second critical dimension CD2, as measured on single wafers. Each dot in the graph of FIG. 2A represents a single wafer for which a CD1 measurement (x-axis) and a CD2 measurement (y-axis) has been recorded. As FIG. 2A illustrates, there is a fairly high degree of correlation between CD1 and CD2 as measured on a single wafer; in general, a lower value of one critical dimension corresponds to a lower value of the other critical dimension, and a higher value of one corresponds to a higher value of the other. Few, if any, wafers included in FIG. 2A have a relatively high value of one critical dimension and a correspondingly low value of the other critical dimension. Thus, it may be determined that, on average, there is a correlation value of 0.74 between CD1 and CD2 on a single wafer, indicating a strong or high correlation between the two dimensions.

FIG. 2B, by contrast, is a graph depicting correlations between the first critical dimension CD1 and wafer thickness Thk. As FIG. 2B illustrates, there is very little correlation between the two measured values; some wafers may have high values or low values for both dimensions, while other wafers have a high thickness and low CD1, and so on. The correlation between thickness Thk and CD1 may thus be determined to be only about 0.15 or lower.

Finally, FIG. 2C is a graph of one parameter measured against the same parameter, such that both the x-axis and y-axis represent the same wafer dimension, such as thickness Thk. As one might expect, such a graph should be a straight line with a slope of 1, as a parameter correlates with itself completely. The correlation value for any single parameter is thus 1.

In general, as FIGS. 2A-2C illustrate, the more closely two parameters are correlated, the more closely a graph comparing the two parameters will approach a line having a slope of 1. Conversely, the less closely two parameters are correlated, the less closely the graph will appear to be a line and thus will have a correlation value approaching 0.

Based on available statistical data, as for example the data illustrated in FIGS. 2A-2C as well as additional data, a first correlation matrix $R_1$ can be constructed:

$$R_1 = \begin{bmatrix} R_{P1,P1} & R_{P1,P2} & \ldots & R_{P1,Pn} \\ R_{P2,P1} & R_{P2,P2} & \ldots & R_{P2,Pn} \\ \vdots & \vdots & \ddots & \vdots \\ R_{Pn,P1} & R_{Pn,P2} & \ldots & R_{Pn,Pn} \end{bmatrix} \quad (5)$$

where each $R_{Px,Py}$ represents a correlation value between one measured parameter Px and another measured parameter Py, as described above. The first correlation matrix $R_1$ includes correlation values $R_{Px,Py}$ only for those parameter measurements that are available and that are used to construct the measurement vector x. Thus, if three parameters have been measured on a first wafer, $R_1$ will be a three by three matrix including correlations between each parameter measured; if five parameters are available, $R_1$ will be a five by five matrix. In the simplest scenario in which just one parameter has been measured on a first wafer, $R_1$ will be a single value identity matrix [1], since a parameter correlated to itself will always have a value of 1, as described above.

Figure 3A:
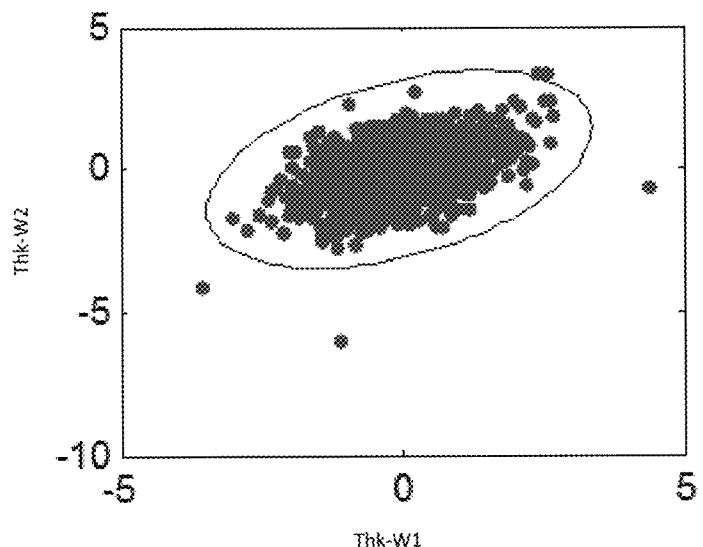
FIG. 3A, FIG. 3B, FIG. 3C, and FIG. 3D depict a portion of another embodiment for constructing a correlation matrix.
Figure 3B:
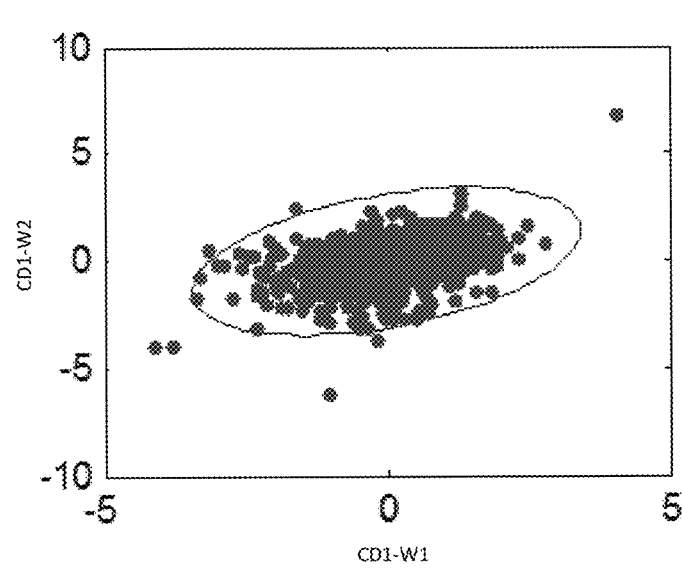
Figure 3C:
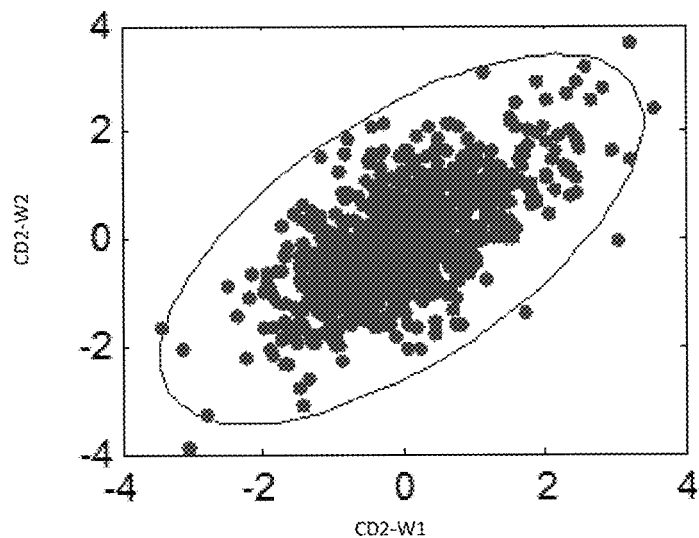
Figure 3D:
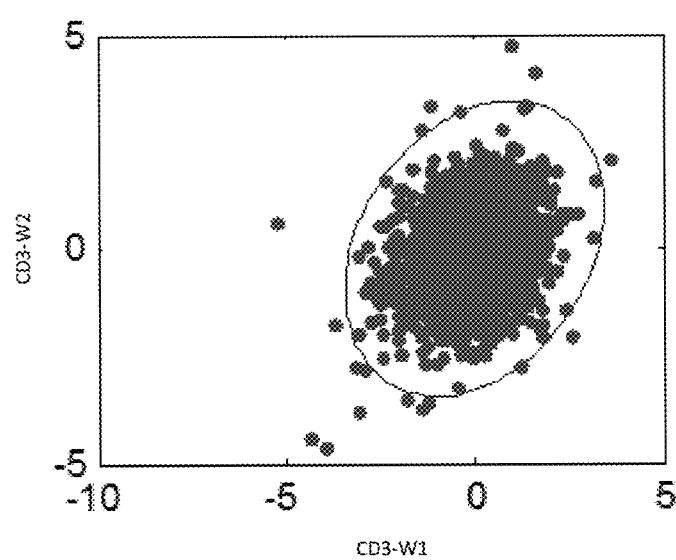

Similarly, an exemplary method for determining correlation values for matrix $R_2$ is illustrated in part by FIGS. 3A-3D. FIG. 3A, for example, is a chart depicting correlations between a thickness Thk-W1 of a first wafer and a thickness Thk-W2 of a second wafer. FIG. 3B is a chart depicting correlations between CD1 for the first wafer W1 and the same CD1 for the second wafer W2, FIG. 3C depicts correlations between CD2 for the first wafer and the same CD2 for the second wafer. FIG. 3D depicts correlations between CD3 for the first wafer and the same CD3 for the second wafer. Each dot in the graphs represents the measurement of the same parameter on the two measured wafers, and a correlation value may be similarly derived for each parameter between wafers as described above for correlations of different parameters taken from a single wafer. Based on the available data measured for parameters of any two wafers of a wafer batch, the second matrix $R_2$ may be constructed:

$$R_2 = \begin{bmatrix} R_{P1W1,P1W2} & 0 & \ldots & 0 \\ 0 & R_{P2W1,P2W2} & \ldots & 0 \\ \vdots & \vdots & \ddots & \vdots \\ 0 & 0 & \ldots & R_{PnW1,PnW2} \end{bmatrix} \quad (6)$$

where each $R_{PxW1,PxW2}$ represents a correlation value between one measured parameter Px on the first wafer (W1) and the same measured parameter Px on the second wafer (W2). Note that other values of the $R_2$ matrix are set at 0, as it may be, in one embodiment, be assumed that no significant correlation exists between one parameter measured on the first wafer and a different parameter measured on the second wafer.

It may be noted that, as used above, $R_1$ may refer generally to a correlation matrix for measurements taken from a single wafer, and $R_2$ may refer generally to a correlation matrix for similar parameter measurements taken for any two wafers in a batch; the subscripts 1 and 2 do not refer to the first and second wafers. In practice, an $R_1$ matrix is constructed for each sampled wafer for which any one or more parameters have been measured, and an $R_2$ matrix is constructed for each pair of sampled wafers, within a batch of wafers, for which at least one parameter in common has been measured for both wafers in the pair.

Matrices $R_1$ and $R_2$ for each sampled wafer and pairs of sampled wafers may then be combined into the correlation matrix R. For the case of two wafers for which parameters have been measured, R is:

$$R = \begin{bmatrix} R_{1,W1} & \frac{1}{2}\begin{pmatrix} R_{1,W1}R_{2,W1W2} + \\ R_{1,W2}R_{2,W1W2} \end{pmatrix} \\ \frac{1}{2}\begin{pmatrix} R_{1,W2}R_{2,W1W2} + \\ R_{1,W1}R_{2,W1W2} \end{pmatrix} & R_{1,W2} \end{bmatrix} \quad (7)$$

As those with skill in the art will recognize, the matrix R may be expanded to accommodate three or more sampled wafers, with a corresponding number of $R_1$ matrices and pairings of $R_1$ and $R_2$ matrices between pairs of wafers. Those with skill in the art will also recognize that for any number n measurements obtained across one or more sampled wafers of a batch, the resulting correlation matrix R will be a n×n matrix of correlation values, where each value in the correlation matrix R represents either a) the correlation value between two parameters measured on a single wafer, or b) the correlation value between a parameter measured on one wafer and the same parameter measured on another wafer. This construction of the correlation matrix R, as described above, allows for R to be recalculated at any time whenever one or more additional parameter measurements are available from a wafer, regardless of whether the additional one or more parameters are taken from a wafer already measured or from a different wafer.

The example below illustrates the methods described in part above. One or more first process measurements are obtained from a first wafer, generally one wafer selected for measurement from a batch of wafers. For the purposes of the example described here, one measurement obtained from the first wafer may be a first wafer thickness Thk1. For instance, the thickness Thk1 may have a measured value of 0.344. The corresponding first correlation matrix R is [1], as:

$$R_{1,W1} = [R_{Thk1,Thk1}] = [1] \quad (8)$$

and $R_2$ is 0, as no parameters are yet measured on any other wafers. The $T^2$ value is then:

$$T^2 = [0.344][1]^{-1}[0.344] = 0.118 \quad (9)$$

A typical confidence value α for a three-sigma distribution may be 0.9973, thus the chi-square distribution value may be calculated as:

$$\chi^{-2}(0.9973, 1) = 9.00 \quad (10)$$

As the $T^2$ value is less than the value of $\chi^{-2}$ it may be concluded that the thickness of the first wafer falls within an acceptable thickness range, and the fabrication tool is operating within acceptable limits (and thus is not operating out of control). Thus, the fabrication tool may be allowed to continue processing other wafers.

One or more additional first process measurements may be obtained as additional metrology processes are applied to the first wafer. For example, after undergoing metrology processes for measuring wafer thickness, the first wafer may undergo additional metrology processes to determine other dimensions, such as a first critical dimension and a second critical dimension. The additional first process measurements, for instance CD1=−1.504 and CD2=−1.456, are included in the measurement vector x:

$$x = [0.344 \; -1.504 \; -1.456] \quad (11)$$

The corresponding correlation matrix R will again correspond the correlation matrix $R_1$ for the first wafer, as no parameters from other wafers have yet been measured. $R_1$ and thus R may then be constructed based on the available measurements Thk, CD1, and CD2:

$$R = \begin{bmatrix} 1 & 0.01 & 0.03 \\ 0.01 & 1 & 0.74 \\ 0.03 & 0.74 & 1 \end{bmatrix} \begin{matrix} Thk \\ CD1 \\ CD2 \end{matrix} \quad \begin{matrix} Thk & CD1 & CD2 \end{matrix} \quad (12)$$

Then, $$T^2 = \qquad (13)$$
$$[0.344 \; -1.504 \; -1.456] \begin{bmatrix} 1 & 0.01 & 0.03 \\ 0.01 & 1 & 0.74 \\ 0.03 & 0.74 & 1 \end{bmatrix}^{-1} \begin{bmatrix} 0.344 \\ -1.504 \\ -1.456 \end{bmatrix} = 2.66$$

The corresponding $\chi^{-2}$ value is:

$$\chi^{-2}(0.9973, 3) = 14.2 \quad (14)$$

Again, because $T^2$ is less than the $\chi^{-2}$ value, it may be concluded that the fabrication tool that produced the first wafer (e.g., the sample wafer undergoing measurement) is producing acceptable wafers, and therefore not operating out of control. This may be true even if any one of the measurements Thk1, CD1, or CD2 falls outside of the three-sigma control limit.

One or more second process measurements may be obtained as metrology processes are applied to a second wafer. For example, a thickness Thk2 may be obtained for a second wafer. An $R_1$ matrix for the second wafer W2 would be $R_1=[1]$. The $R_2$ matrix may be constructed based on a correlation value for thickness measurements between wafers. For example, if the correlation value for a thickness parameter is about 0.41, then the $R_2$ matrix is $R_2=[0.41]$. The overall correlation matrix is given by equation 7:

$$R = \begin{bmatrix} R_{1,W1} & \frac{1}{2}\begin{pmatrix} R_{1,W1}R_{2,W1W2} + \\ R_{1,W2}R_{2,W1W2} \end{pmatrix} \\ \frac{1}{2}\begin{pmatrix} R_{1,W2}R_{2,W1W2} + \\ R_{1,W1}R_{2,W1W2} \end{pmatrix} & R_{1,W2} \end{bmatrix} \quad (7)$$

which, using the example correlation values above, may result in R:

$$R = \begin{bmatrix} 1 & 0.01 & 0.03 & 0.29 \\ 0.01 & 1 & 0.74 & -0.01 \\ 0.03 & 0.74 & 1 & 0.03 \\ 0.29 & -0.01 & 0.03 & 1 \end{bmatrix} \quad (15)$$

As the example above illustrates, the correlation matrix R may be expanded to include and accommodate parameter measurements as they are obtained, and the $T^2$ value calculated at any stage of metrology to determine whether a fabrication tool is out of control and should be shut down, or whether the fabrication tool is still operating within normal parameters and producing acceptable wafers.

Furthering the example above, the calculation of $T^2$ below assumes that measurements for thickness, CD1, CD2, and CD3 have been obtained for a first wafer and a second wafer of a batch of wafers. The measurement vector x in this example may be, for instance, $$x=[0.344\ -1.504\ -1.456\ -2.303\ 1.077\ -0.494\ -0.838\ -3.04] \quad (16)$$

corresponding to Thk1=0.344, Thk2=1.077, and so on. The corresponding correlation matrix R may then be:

$$R = \begin{bmatrix} 1 & 0.00 & 0.01 & 0.04 & 0.29 & 0.00 & 0.01 & 0.04 \\ 0.00 & 1 & 0.74 & 0.15 & -0.01 & 0.42 & 0.39 & 0.06 \\ 0.01 & 0.74 & 1 & 0.03 & 0.03 & 0.39 & 0.64 & 0.02 \\ 0.04 & 0.15 & 0.03 & 1 & 0.10 & 0.06 & 0.02 & 0.41 \\ 0.29 & -0.01 & 0.03 & 0.10 & 1 & 0.00 & 0.01 & 0.04 \\ 0.00 & 0.42 & 0.39 & 0.06 & 0.00 & 1 & 0.74 & 0.15 \\ 0.01 & 0.39 & 0.64 & 0.02 & 0.01 & 0.74 & 1 & 0.03 \\ 0.04 & 0.06 & 0.02 & 0.41 & 0.04 & 0.15 & 0.03 & 1 \end{bmatrix} \quad (17)$$

The resulting $T^2$ value, based on equations 16 and 17, is 14.8. The corresponding $\chi^{-2}$ value is:

$$\chi^{-2}(0.9973, 8) = 23.6 \quad (18)$$

Again, as $T^2$ is less than the $\chi^{-2}$ value, it may be concluded that the fabrication tools in question are still operating within normal parameters.

Figure 4:
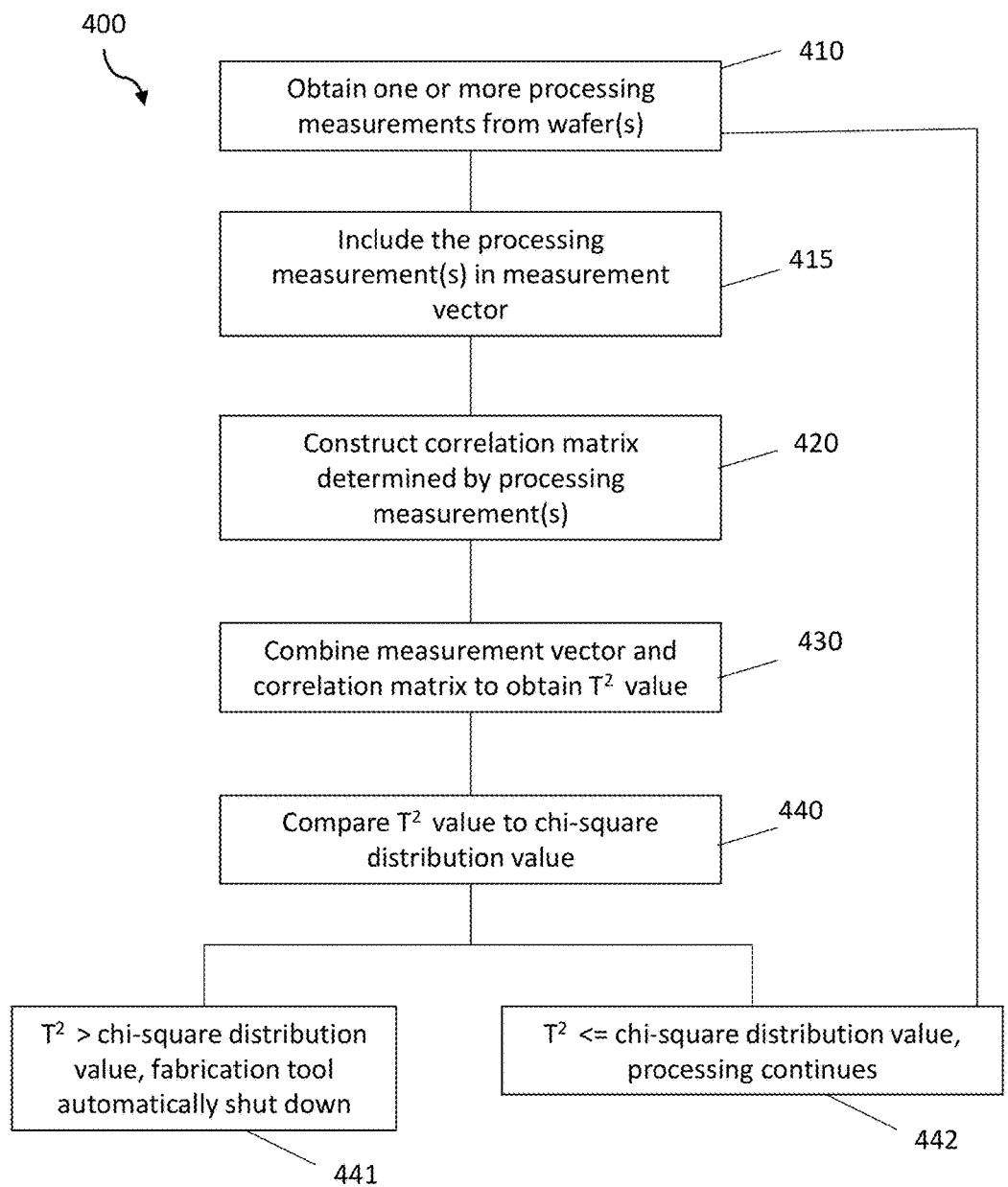
FIG. 4 is a block diagram depicting a further embodiment of a process for determining when to stop a fabrication tool and depicts a method for obtaining a $T^2$ value.

FIG. 4 is a block diagram depicting one embodiment of a process 400 for automatically determining when to shut down a fabrication tool. At block 410, one or more processing measurements are obtained from a wafer or wafers. This could include measurements from a first wafer from which measurements are available, or one or more processing measurements from multiple wafers, as measurements are iteratively obtained through a semiconductor fabrication process or processes. The processing measurements, at block 415, are included in a measurement vector. At block 420, a correlation matrix is constructed. The correlation matrix includes correlation values determined by the processing measurements obtained from the wafer or wafers as indicated at block 410. At block 430, the measurement vector and correlation matrix are combined to determine a $T^2$ value. The $T^2$ value is compared, at block 440, to a chi-square distribution value, where the chi-square distribution value is determined by the number of processing measurements made at block 410 and included in a measurement vector at block 415 (providing a degrees of freedom value for a chi-square distribution value) and a preselected confidence value. In other embodiments, a different preselected confidence value may be used, other than as determined by a chi-square distribution value (not shown) at block 440, to determine whether a $T^2$ value represents operation of a fabrication tool that is performing out of control. If the $T^2$ value is greater than the chi-square distribution (or other critical) value, then at block 441 a significant processing error is detected, and the fabrication tool is automatically shut down. If the $T^2$ value is less than or equal to the chi-square distribution (or other critical) value, then at block 442 processing continues.

As additional measurements become available from the same wafers from which measurements had already been obtained or from additional wafers, the process 400 is repeated, returning again to block 410 for obtention of available measurements (including those previously obtained and newly available measurements), creating a new measurement vector by including all available processing measurements therein at block 415, etc. In this way, evaluation of fabrication tool performance and detection of out of control processing may continue through a processing step or steps, to be continuously updated as often as new measurements become available.

Repeatedly updating a $T^2$ value and repeatedly comparing it to a chi-square distribution (or other critical) value significantly improves the technological field of semiconductor chip manufacturing in various ways. For example, false alarm rates where out of control fabrication processing is erroneously identified may be significantly reduced compared to conventional methodology for determining stoppage of fabrication tool functioning, reducing the time lost to such erroneous stoppages. According to a method as disclosed herein, out of control functioning of semiconductor fabrication tools may be ascertained with a higher degree of reliability than is conventionally possible, using measurements of various fabrication processing parameters as they become available, and on wafers as they become available, without the need for a given measurement to have been obtained for all wafers for an assessment of out of control function to be performed.

As explained above, application of conventional statistical process control rules may lead to expensive, time-consuming, and unnecessary delays in semiconductor wafer manufacturing with no corresponding improvement in semiconductor wafer quality or consistency. Simultaneously, delays required for the performance of conventional statistical processing control determinations for tool stoppage due to out-of-control processing (such as when determining out-of-control processing is delayed because a requisite number of measurements required for performance of such methods are not yet available) can result in inefficient processing of wafer fabrication after out-of-control processing has begun but before it has been detected. Stopping fabrication tool operation based on multivariate statistical processing control rules as disclosed herein rather than conventional processes of stopping tool operation greatly improves the reliability of assessment of fabrication tool operation and significantly prevents delays and reduces production costs and efficiency. In semiconductor device High Volume Manufacturing (HVM), a process may be run on multiple tools, each tool may be configured with multiple chambers. Differences between the performance of different tools and chambers/tools that run the same process, may contribute to variation in the parameters' values measured on the product wafer. Process variability in HVM is well-known to be a significant and substantial impediment resulting in yield losses or, worse yet, device failure in the field (i.e., poor reliability). Stopping/blocking processes on the chamber(s)/tool/tool family as soon as performance begins to exhibit signs of increased variability helps to reduce wafer exposure and yield losses.

In simulations comparing conventional univariate statistical methods with the method disclosed herein for determining out-of-control fabrication processing, the herein disclosed method results in an approximately 75% reduction in out-of-control process signaling resulting in fabrication tool stoppage, most likely because of the avoidance of false positive signals (i.e., indications of out-of-control processing be conventional methods that erroneously signified the occurrence of out-of-control processing when it was not present). As would be appreciated by those with skill in the field of the method disclosed herein, variations on when or how out-of-control processing is identified could be implemented to decrease the risk if unnecessary tool stoppage (e.g., by minimizing likelihood of wrongly identifying out-of-control processing), or decreasing the risk of wafer fabrication resulting in inconsistency, unreliability, variability, and/or other disadvantageous qualities of a lot or lots of wafers (e.g., by minimizing the risk of wrongly failing to identify out-of-control processing and accordingly failing to stop fabrication tool operation before production of wafers that do not conform to applicable standards). Such variations, which may depend on the particular circumstances in which the method disclosed herein is applied, may be accommodated by different embodiments of the method disclosed herein and are expressly included.

In some embodiments, fabrication tool operation is stopped what a $T^2$ value exceeds a critical value and the critical value is a chi-square distribution value for a pre-determined confidence level. However, as mentioned above, other critical values may be used for determining whether a given $T^2$ value, or series of $T^2$ values obtained from sets of measurements obtained from successive lots of fabricated wafers, signifies out of control processing requiring tool stoppage. For example, rather than asking whether a $T^2$ value after a single measurement set exceeds a chi-square distribution value, patters of $T^2$ value across multiple fabrication lots, or on a rolling basis during ongoing fabrication of a plurality of wafers, may be used to determine tool stoppage.

Figure 5:
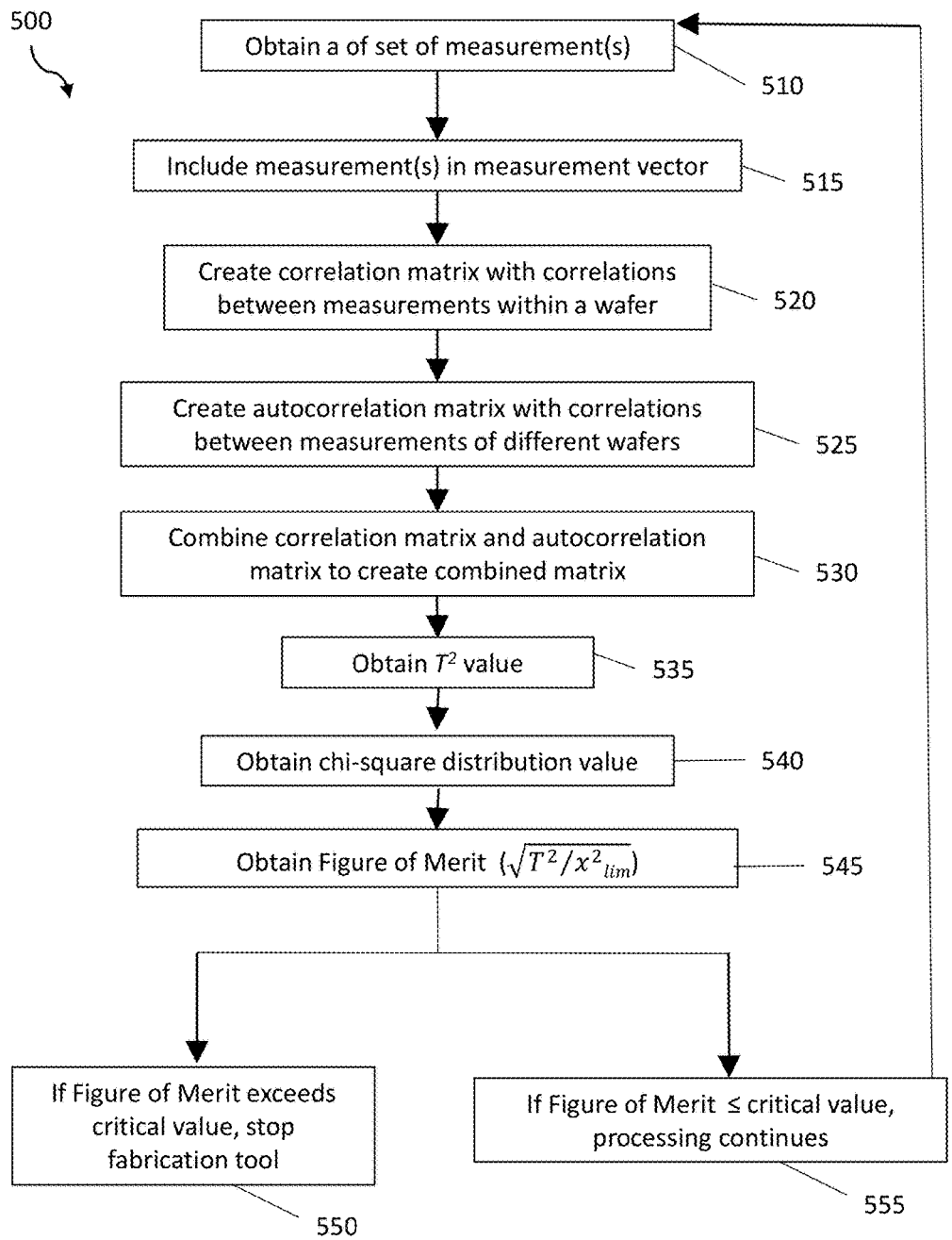
FIG. 5 is a block diagrams depicting still further embodiments of a process for determining when to shut down a fabrication tool.

FIG. 5 is a block diagram depicting one embodiment of a process 500 for automatically determining when to shut down a fabrication tool. At block 510, a set of measurements (which may include measurements of different parameters from each of one or more wafer, and/or measurements of one or more parameter from different wafers) is obtained. This could include measurements from a first wafer from which measurements are available, or one or more processing measurements from multiple wafers, as measurements are iteratively obtained through a semiconductor fabrication process or processes. The processing measurements, at block 515, are included in a measurement vector. At block 520, a correlation matrix is constructed. The correlation matrix includes correlation values determined by the processing measurements obtained from the wafer or wafers as indicated at block 510 and includes correlations of different measurements within each wafer. At block 525, an autocorrelation matrix is created, including correlations of measurements of a parameter between pairs of wafers in the measurement set. At block 530, the correlation matrix and autocorrelation matrix are combined to create a combined matrix, to obtain a $T^2$ value, at block 535. At block 545, a Figure of Merit is obtained, wherein the square root is obtained of the ratio of the $T^2$ value to a chi-square distribution value, where the chi-square distribution value is determined by the number of processing measurements made at block 510 and included in a measurement vector at block 515 (providing a degrees of freedom value for a chi-square distribution value) and a pre-selected confidence value ($\chi^2_{lim}$). In other embodiments, a different preselected confidence value may be used, other than as determined by a chi-square distribution value (not shown) at block 540, to determine whether a $T^2$ value represents operation of a fabrication tool that is performing out of control. For example, instead of the square root of the ration of $T^2$ value to chi-squared value, the ratio of $T^2$ value to chi-squared value could be used. If the Figure of Merit is greater than a pre-determined critical value, then at block 550 a significant processing error is detected, and the fabrication tool is stopped. If the Figure of Merit is not greater than a pre-determined critical value, then at block 555 processing continues.

As additional measurements become available from the same wafers from which measurements had already been obtained or from additional wafers, the process 500 is repeated, returning again to block 510 for obtention of available measurements from additional measurement sets (including those previously obtained and newly available measurements), creating a new measurement vector by including all available processing measurements therein at block 515, etc. In this way, evaluation of fabrication tool performance and detection of out of control processing may continue through a processing step or steps, to be continuously updated as often as new measurements become available. In this way, patterns of $T^2$ values and statistical characterizations derived therefrom across multiple measurement sets may exceed a predetermined critical value causing fabrication tool stoppage.

Figure 6:
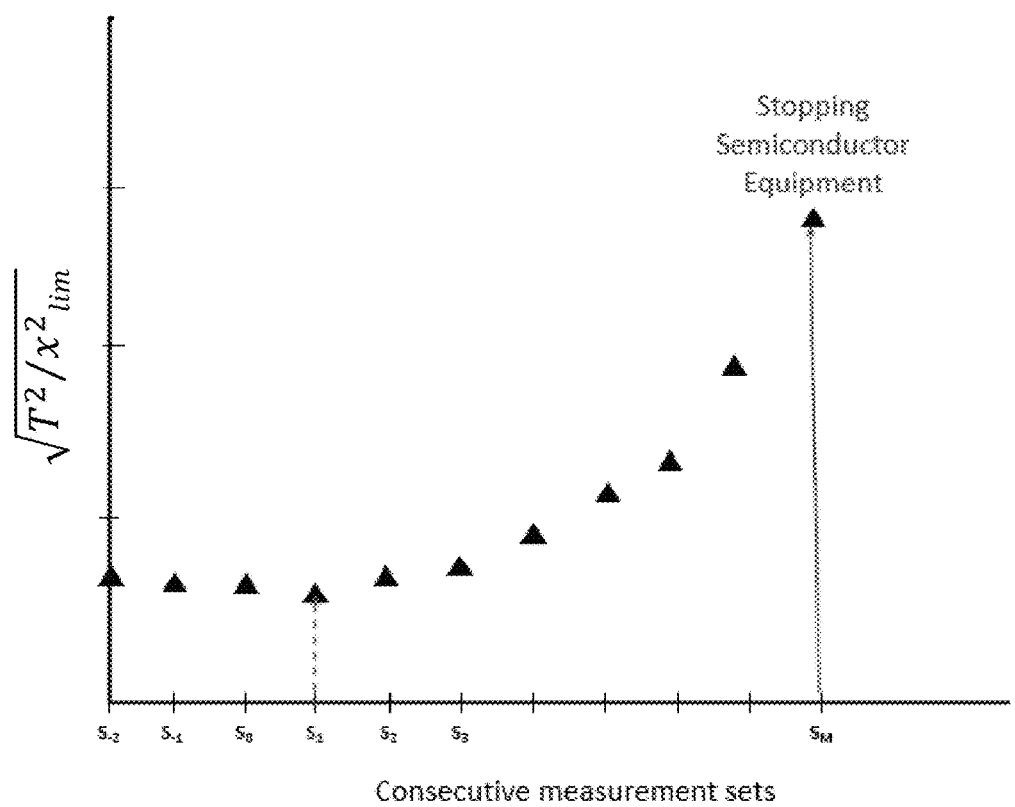
FIG. 6, FIG. 7, and FIG. 8 are graphical representations of patterns of figures of merit over consecutive measurement sets that may signify out-of-control processing and cause stoppage of fabrication tool operation in some examples.

For example, if a $T^2$ value from a single measurement set exceeds the chi-square distribution value corresponding to the number of measurements used to create the $T^2$ value for that measurement set as the degrees of freedom, at a pre-selected confidence interval, the process may be determined to be out-of-control and fabrication tool operation may be stopped. Alternatively, the relationship of $T^2$ values for successive measurement sets may be compared and out-of-control processing leading to fabrication tool stoppage signified when patterns of relationships between $T^2$ values and chi-square values are obtained. For example, even if $T^2$ values do not exceed chi-square values for successive measurement sets, out-of-control processing could be signified if the square root of the ratio of $T^2$ value to chi-square value (or other Figure of Merit) continuously increases for a series of consecutive measurement sets. An example is shown in FIG. 6, where the square root of the ratio of $T^2$ value to chi-square value for consecutive, successive measurement sets continuously increases beginning at measurement set 1 ($S_1$) and continuing through measurement set M ($S_M$). The Y axis shows the square root of the ratio of $T^2$ value to chi-square value for a predetermined confidence level ($\chi^2_{lim}$).

For example, suppose 10 measurements of parameters were included in a measurement set, and a pre-determined confidence value was set at $\alpha$=0.0027. From a chi-square distribution table, a chi-square value that would be needed to reach a confidence level of $\alpha$=0.0027 (that is, 0.27% likely to occur) is 26.9. Thus, using a $T^2$ value from a single set of measurements, if a confidence level of 0.27% were selected, with 10 degrees of freedom (i.e., 10 measurements used for obtaining the $T^2$ value), and tool stoppage for out-of-control processing was signified by a $T^2$ value that exceeded such a chi-square value for any single set of measurements, tool operation may stop if the $T^2$ value exceeded 26.9. If a $T^2$ value of 30 were obtained, it would signify out-of-control processing and fabrication tool processing would stop, according to this non-limiting example.

In other examples, however, the square root of a ratio of $T^2$ value to chi-square value may be obtained from multiple sets of measurements to provide a Figure of Merit. A figure of merit would be understood by skilled artisans to mean a numerical expression representing the performance of a fabrication procedure. Using the numerical examples from above, the square root of the ratio of a $T^2$ value of 30 divided by a chi-square value of 26.9 would yield a figure of merit one of approximately 1.06, for example. After a pre-determined number of consecutive measurement sets yielding progressively increasing figures of merit, fabrication tool operation may be stopped because out-of-control operation has been signified, in accordance with this embodiment. In some examples, six consecutive measurement sets of progressively increasing figures of merit (i.e., figure of merit increases for six consecutive measurement sets) may signify out of control operation and cause fabrication tool stoppage. In other examples, fewer consecutive measurement sets displaying this pattern, such as five or four, or more than six consecutive measurement sets, such as seven or eight, may signify out-of-control processing to cause tool stoppage.

Figure 7:
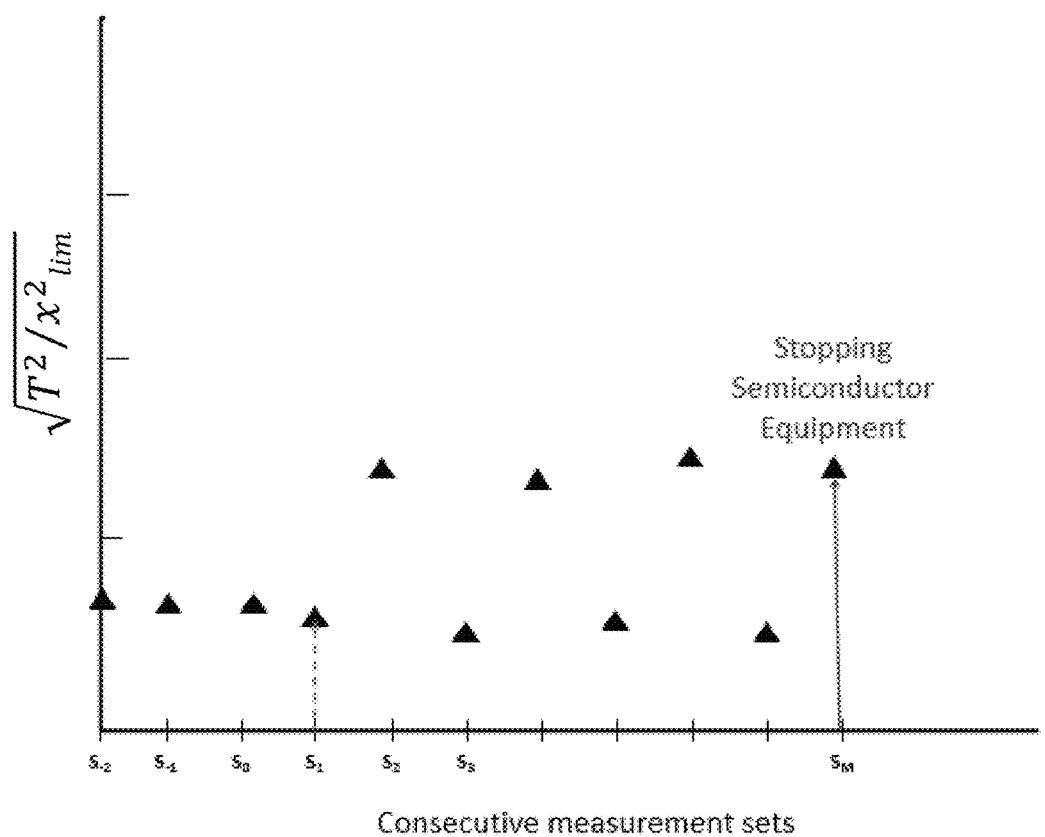
Figure 8:
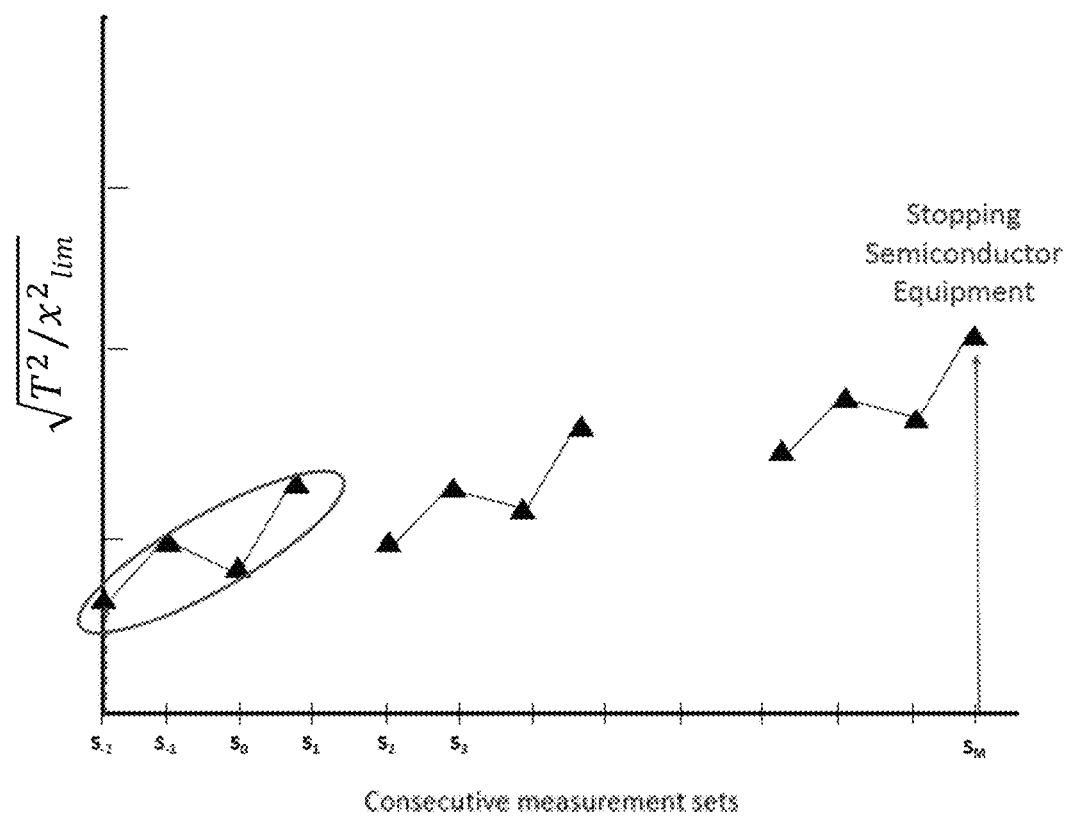

In another example, out-of-control processing could be signified if the figure of merit for successive measurement sets alternates between being higher than and lower than the figure of merit for the preceding measurement set. Examples shown in FIGS. 7 and 8, where the figure of merit (i.e., square root of the ratio of $T^2$ value to chi-square value) for consecutive, successive measurement sets alternatively oscillates from increasing to decreasing, relative to the preceding figure of merit, from measurement set 1 ($S_1$) through measurement set M ($S_M$). The Y axis shows the square root of the ratio of $T^2$ value to chi-square value for a predetermined confidence level ($\chi^2_{lim}$), that is the figure of merit. After a pre-determined number of measurement sets yielding figures of merit that oscillate alternatively from being higher then lower that the immediately preceding figure of merit, fabrication tool operation may be stopped because out-of-control operation has been signified, according to this embodiment. In some examples, anywhere from eleven to seventeen consecutive measurement sets alternatively oscillating between being higher than and lower than the figure of merit for the immediately preceding measurement set may signify out of control operation and cause fabrication tool stoppage. In a non-limiting example, fourteen consecutive measurement sets alternating between being higher than and lower than the figure of merit for the immediately preceding measurement set may signify out of control operation and cause fabrication tool stoppage.

In other examples, patterns of figures of merit within ranges between zero and one may signify out-of-control processing. Skilled artisans would recognize "zones" around a measure of central tendency with varying degrees of likelihood that a particular measurement would occur within a given zone. For example, a figure of merit between zero and one third may be considered to be within zone C, from one third to two thirds as within zone B, and from two thirds to one to be within zone A, and there may be a decreasing likelihood that a randomly selected sample from a given population may fall within zones C, B, or A, respectively. However, some degree of ordinary, random variability may lead to figures of merit for some measurements sets falling within any of the three zones on occasion, without necessarily signifying out-of-control processing. But patterns of figures of merit persisting in any given zone or zones could signify more than random variability and may result in fabrication tool stoppage.

For example, a predetermined critical value may be exceeded, signifying out-of-control processing and causing stoppage of fabrication tool operation, if the figure of merit for each of two or more out of three consecutive measurement sets, or each of four or more out of six consecutive measurement sets, or each of six or more out of nine consecutive measurement sets is greater than two thirds. Alternatively, a predetermined critical value may be exceeded, signifying out-of-control processing and causing stoppage of fabrication tool operation, if a figure of merit for each of four or more out of five consecutive measurement sets is greater than one third. In another example, a predetermined critical value may be exceeded, signifying out-of-control processing and causing stoppage of fabrication tool operation, if the figure of merit for each of fourteen, fifteen, or sixteen consecutive measurement sets is between zero and one third. In another example, a predetermined critical value may be exceeded, signifying out-of-control processing and causing stoppage of fabrication tool operation, if the figure of merit for each of seven, eight, or nine consecutive measurement sets is greater than one third.

In still other examples, zones A, B, and C are determined by equivalency to a cumulative distribution function for a normal distribution curve required to attain the probability of a $T^2$ value as determined by comparison to a chi-square distribution. For example, zones A, B, and C, in statistical processing control, may in some circumstances refer to zones of probability of a given number of standard deviations (or $\sigma$) from the mean, with zone C corresponding to values that fall between zero and one $\sigma$ above the mean, zone B corresponding to values that fall between one and two $\sigma$ above the mean, and zone A corresponding to values that fall within two to three $\sigma$ above the mean. The corresponding cumulative distribution functions for values falling below or with zones C, B, and A is approximately 68.27%, 95.45%, and 99.73%, respectively, meaning that fewer than 0.27% of values would be predicted to fall above zone A (i.e., more than three $\sigma$ above the mean).

An inverse chi-square function may be performed using the $T^2$ value and degrees of freedom (i.e., number of measurements used to obtain the $T^2$ value) to determine the probability of obtaining the $T^2$ value if it were a chi-square value. Then, the number of standard deviations (i.e., $\sigma$) from the mean of a normal distribution that would correspond to the probability value obtained may yield a sigma coefficient, (i.e., how many sigmas above the mean of a normal distribution would a value need to be in order to have the same probability of occurring as the $T^2$ value had the $T^2$ value been a chi-square value with the given degrees of freedom). If the $\sigma$ coefficient were between zero and one, one and two, or two and three, then a given $T^2$ value would generally correspond, probabilistically, to samples of a normally distributed population falling within said ranges from the mean of the population. For example, using the numerical examples from above by way of illustration, if a $T^2$ value of 30 were obtained, with 10 measurements used (i.e., 10 degrees of freedom), the probability of obtaining a chi-square value of the same $T^2$ value with 10 degrees of freedom can be obtained from a chi-square distribution, which is shown to be 0.0857%. Thus, the probability of obtaining a $T^2$ value with 10 degrees of freedom less than 30 is approximately 99.914%. By comparison to a cumulative distribution function of a normal distribution curve, a sigma coefficient of 3.33 (i.e., a value 3.33 $\sigma$ above the mean) would be required in order to obtain such a figure (i.e., approximately 99.914% of samples within a normal distribution would be within approximately 3.33 $\sigma$ above the mean). Thus, in this example, the sigma coefficient for that $T^2$ value would be 3.33.

Figure 9:
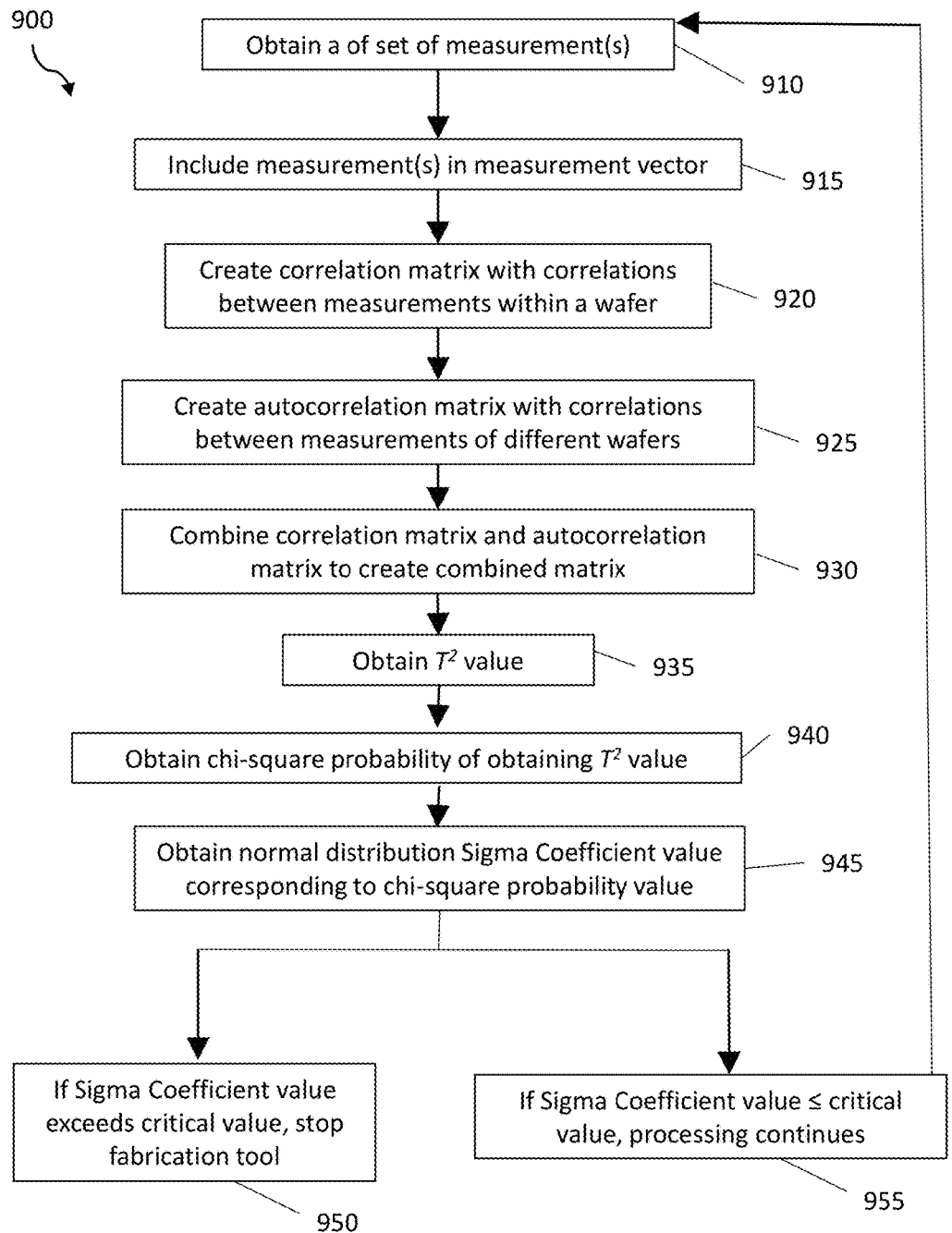
FIG. 9 is a block diagrams depicting still further embodiments of a process for determining when to shut down a fabrication tool.

FIG. 9 is a block diagram depicting one embodiment of a process 900 for automatically determining when to shut down a fabrication tool. At block 910, a set of measurements (which may include measurements of different parameters from each of one or more wafer, and/or measurements of one or more parameter from different wafers) is obtained. This could include measurements from a first wafer from which measurements are available, or one or more processing measurements from multiple wafers, as measurements are iteratively obtained through a semiconductor fabrication process or processes. The processing measurements, at block 915, are included in a measurement vector. At block 920, a correlation matrix is constructed. The correlation matrix includes correlation values determined by the processing measurements obtained from the wafer or wafers as indicated at block 910 and includes correlations of different measurements within each wafer. At block 925, an autocorrelation matrix is created, including correlations of measurements of a parameter between pairs of wafers in the measurement set. At block 930, the correlation matrix and autocorrelation matrix are combined to create a combined matrix, to obtain a $T^2$ value, at block 935. At block 940, a chi-square probability of obtaining the $T^2$ value obtained at block 935 is obtained. At block 945, a normal distribution sigma coefficient value corresponding to chi-square probability value obtained at block 940 is obtained. That is, the number of standard deviations above the mean of a normal distribution required to obtain a cumulative distribution function equivalent to the chi-square distribution probability would be obtained. If the sigma coefficient value is greater than a pre-determined critical value, then at block 950 a significant processing error is detected, and the fabrication tool is shut down. If the sigma coefficient is not greater than a pre-determined critical value, then at block 955 processing continues.

As additional measurements become available from the same wafers from which measurements had already been obtained or from additional wafers, the process 900 is repeated, returning again to block 910 for obtention of available measurements from additional measurement sets (including those previously obtained and newly available measurements), creating a new measurement vector by including all available processing measurements therein at block 915, etc. In this way, evaluation of fabrication tool performance and detection of out of control processing may continue through a processing step or steps, to be continuously updated as often as new measurements become available. In this way, patterns of $T^2$ values and statistical characterizations derived therefrom across multiple measurement sets may exceed a predetermined critical value causing fabrication tool stoppage.

Patterns of sigma coefficient values across consecutive measurement sets could be obtained for determinations of whether out-of-control processing is occurring causing stoppage of fabrication tool operation. In some examples, out-of-control processing could be detected and fabrication tool operation stopped if a sigma coefficient from any single set of measurements exceeds a critical value (e.g., 3σ) In another example, a predetermined critical value may be exceeded, signifying out-of-control processing and causing stoppage of fabrication tool operation, if a sigma coefficient for each of two or more out of three consecutive measurement sets, or each of four or more out of six consecutive measurement sets, or each of six or more out of nine consecutive measurement sets is greater than two. Alternatively, a predetermined critical value may be exceeded, signifying out-of-control processing and causing stoppage of fabrication tool operation, if a sigma coefficient for each of four or more out of five consecutive measurement sets is greater than one. In another example, a predetermined critical value may be exceeded, signifying out-of-control processing and causing stoppage of fabrication tool operation, if the sigma coefficient for each of fourteen, fifteen, or sixteen consecutive measurement sets is between zero and one. In another example, a predetermined critical value may be exceeded, signifying out-of-control processing and causing stoppage of fabrication tool operation, if the sigma coefficient for each of seven, eight, or nine consecutive measurement sets is greater than one.

In yet another embodiment, after a pre-determined number of consecutive measurement sets yielding progressively increasing sigma coefficients, fabrication tool operation may be stopped because out-of-control operation has been signified, in accordance with some embodiments. In some examples, six consecutive measurement sets of progressively increasing sigma coefficients (i.e., sigma coefficient increases for six consecutive measurement sets) may signify out of control operation and cause fabrication tool stoppage. In other examples, fewer consecutive measurement sets displaying this pattern, such as five or four, or more than six consecutive measurement sets, such as seven or eight, may signify out-of-control processing to cause tool stoppage.

In another example, out-of-control processing could be signified if the sigma coefficient for successive measurement sets alternates between being higher than and lower than the sigma coefficient for the preceding measurement set. After a pre-determined number of measurement sets yielding sigma coefficients that oscillate alternatively from being higher then lower than the immediately preceding sigma coefficient, fabrication tool operation may be stopped because out-of-control operation has been signified, according to this embodiment. In some examples, anywhere from eleven to seventeen consecutive measurement sets alternatively oscillating between being higher than and lower than the sigma coefficient for the immediately preceding measurement set may signify out of control operation and cause fabrication tool stoppage. In a non-limiting example, fourteen consecutive measurement sets alternating between being higher than and lower than the sigma coefficient for the immediately preceding measurement set may signify out of control operation and cause fabrication tool stoppage.

Furthermore, in some non-limiting examples, creating, constructing, or obtaining measurement vectors, correlation matrixes, autocorrelation matrixes, combined matrixes, $T^2$ values, chi-square values, critical values, figures of merit, sigma coefficients, or any combinations thereof by a computer may provide essential temporal benefits without which the process may be of minimized value. For example, timeliness of assessing out of control processing may be important in some cases in order to assess processing in a way to meaningfully affect tool functioning or malfunctioning. In some such instances, a combined volume of wafers and structural or other parameters thereof may be processed and/or measured at a rate at which it would be difficult or impossible to assess out of control processing in a sufficiently timely manner to stop fabrication tool processing and prevent substantial out of control processing without the use of a computer. In such non-limiting examples, creating, constructing, or obtaining measurement vectors, correlation matrixes, autocorrelation matrixes, combined matrixes, $T^2$ values, or any combinations thereof by a computer may permit assessment of fabrication tool performance in real time, with continual evaluation of out of control performance using new measurements as they are obtained, even if such a volume of process parameters, being different measures and/or from a large and growing volume of processed wafers, were being obtained that determining $T^2$ values in a meaningfully usable time frame would be difficult or not possible.

In some embodiments, aspects of the present invention may take the form of a computer program product embodied in one or more computer readable medium(s). The one or more computer readable medium(s) may have embodied thereon computer readable program code. Various computer readable medium(s) or combinations thereof may be utilized. For instance, the computer readable medium(s) may include a computer readable storage medium, examples of which include (but are not limited to) one or more electronic, magnetic, optical, or semiconductor systems, apparatuses, or devices, or any suitable combination of the foregoing. Example computer readable storage medium(s) include, for instance: an electrical connection having one or more wires, a portable computer diskette, a hard disk or mass-storage device, a random access memory (RAM), read-only memory (ROM), and/or erasable-programmable read-only memory such as EPROM or Flash memory, an optical fiber, a portable compact disc read-only memory (CD-ROM), an optical storage device, a magnetic storage device (including a tape device), or any suitable combination of the above. A computer readable storage medium is defined to include a tangible medium that can contain or store program code for use by or in connection with an instruction execution system, apparatus, or device, such as a processor. The program code stored in/on the computer readable medium therefore produces an article of manufacture (such as a "computer program product") including program code.

Figure 10:
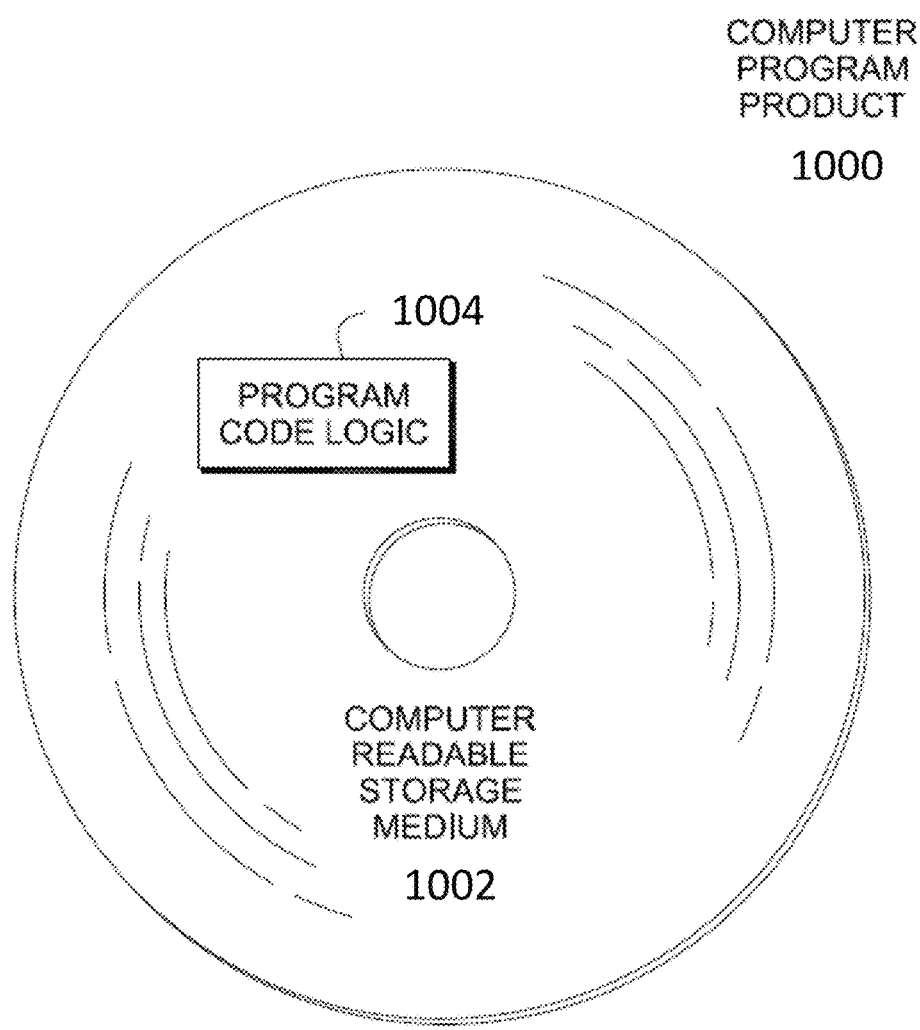
FIG. 10 illustrates an embodiment of a computer program product, in accordance with one or more aspects of the present invention.

Referring now to FIG. 10, in one example, a computer program product 1000 includes, for instance, one or more computer readable media 1002 to store computer readable program code means or logic 1004 thereon to provide and facilitate one or more aspects of the present invention.

Program code contained or stored in/on a computer readable medium can be obtained and executed by a data processing system (computer, computer system, etc. including a component thereof) and/or other devices to cause the data processing system, component thereof, and/or other device to behave/function in a particular manner. The program code can be transmitted using any appropriate medium, including (but not limited to) wireless, wireline, optical fiber, and/or radio-frequency. Program code for carrying out operations to perform, achieve, or facilitate aspects of the present invention may be written in one or more programming languages. In some embodiments, the programming language(s) include object-oriented and/or procedural programming languages such as C, C++, C#, Java, etc. Program code may execute entirely on the user's computer, entirely remote from the user's computer, or a combination of partly on the user's computer and partly on a remote computer. In some embodiments, a user's computer and a remote computer are in communication via a network such as a local area network (LAN) or a wide area network (WAN), and/or via an external computer (for example, through the Internet using an Internet Service Provider).

In one example, program code includes one or more program instructions obtained for execution by one or more processors. Computer program instructions may be provided to one or more processors of, e.g., one or more data processing system, to produce a machine, such that the program instructions, when executed by the one or more processors, perform, achieve, or facilitate aspects of the present invention, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

The flowcharts and block diagrams depicted and described with reference to the Figures illustrate the architecture, functionality, and operation of possible embodiments of systems, methods and/or computer program products according to aspects of the present invention. These flowchart illustrations and/or block diagrams could, therefore, be of methods, apparatuses (systems), and/or computer program products according to aspects of the present invention.

In some embodiments, as noted above, each block in a flowchart or block diagram may represent a module, segment, or portion of code, which includes one or more executable instructions for implementing the specified behaviors and/or logical functions of the block. Those having ordinary skill in the art will appreciate that behaviors/functions specified or performed by a block may occur in a different order than depicted and/or described, or may occur simultaneous to, or partially/wholly concurrent with, one or more other blocks. Two blocks shown in succession may, in fact, be executed substantially concurrently, or the blocks may sometimes be executed in the reverse order. Additionally, each block of the block diagrams and/or flowchart illustrations, and combinations of blocks in the block diagrams and/or flowchart illustrations, can be implemented wholly by special-purpose hardware-based systems, or in combination with computer instructions, that perform the behaviors/functions specified by a block or entire block diagram or flowchart.

In some embodiments, a data processing system (computer, computer system, etc. including a component thereof) employing code to perform the processes disclosed herein may be coupled to one or more measurement devices, also known as metrology devices, such as a four-point wafer probe, a reflectometer, a stress gauge, an ellipsometer, a surface profiler, and/or other measurement devices. The data processing system may receive measurements of one or more physical parameters, of one or more sampled wafers, from the one or more measurement devices to perform data or statistical analysis processes as described herein, in accordance with one or more aspects of the invention. The data processing system may also be coupled to one or more fabrication tools so that the data processing system may control and shut down the fabrication tools when it is determined, according to the processes described herein, that a process has failed or is out of control. Such fabrication tools may include, but are not limited to, lithographic etching tools, wet etching tools, chemical-mechanical polishing tools, chemical or physical vapor deposition tools, and so on.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method for stopping semiconductor fabrication, comprising:
   obtaining a plurality of sets of measurements wherein each set of measurements comprises a measurement of each of one or more parameters from each of one or more semiconductor wafers;
   for a set of measurements, creating a measurement vector, creating one or more correlation matrixes comprising correlations between measurements of parameters of a semiconductor wafer, creating one or more autocorrelation matrixes comprising correlations of a parameter between a pair of the one or more semiconductor wafers, creating a combined matrix by combining the one or more correlation matrixes and the one or more autocorrelation matrixes, obtaining a $T^2$ value from the measurement vector and the combined matrix, obtaining a chi-square distribution value comprising a degrees of freedom value and a preselected confidence value wherein the degrees of freedom value comprises the number of measurements in the measurement vector, and creating a figure of merit wherein the figure of merit is the square root of the ratio of the $T^2$ value to the chi-square distribution value; and
   stopping a semiconductor wafer fabrication tool if a figure of merit from one or more measurement sets exceeds a critical value.

2. The method of claim 1, wherein a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

3. The method of claim 1, wherein a figure of merit from one or more measurement sets exceeds a critical value when the figure of merit for each of five, six, or seven consecutive measurement sets is greater than the figure of merit for the immediately previous measurement set.

4. The method of claim 1, wherein a figure of merit from one or more measurement sets exceeds a critical value when the figure of merit for each of six consecutive measurement sets is greater than the figure of merit for the immediately previous measurement set.

5. The method of claim 4, wherein a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

6. The method of claim 1, wherein a figure of merit from one or more measurement sets exceeds a critical value when the figures of merit for fourteen consecutive measurement sets alternate between being higher than and lower than the figure of merit for the immediately preceding measurement set.

7. The method of claim 1, wherein a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

8. A method for stopping semiconductor fabrication, comprising:
   obtaining a plurality of sets of measurements wherein each set of measurements comprises a measurement of each of one or more parameters from each of one or more semiconductor wafers;
   for a set of measurements, creating a measurement vector, creating one or more correlation matrixes comprising correlations between measurements of parameters of a semiconductor wafer, creating one or more autocorrelation matrixes comprising correlations of a parameter between a pair of the one or more semiconductor wafers, creating a combined matrix by combining the one or more correlation matrixes and the one or more autocorrelation matrixes, and obtaining a $T^2$ value from the measurement vector and the combined matrix, obtaining a probability value comprising the probability of obtaining a chi-square value with a degrees of freedom value comprising the number of measurements in the measurement vector wherein the chi-square value is the $T^2$ value, and obtaining a sigma coefficient value of a univariate normal distribution corresponding to the probability; and
   stopping a semiconductor wafer fabrication tool if a sigma coefficient value from one or more measurement sets exceeds a critical value.

9. The method of claim 8, wherein a measurement vector, a correlation matrix, an autocorrelation matrix, a combined matrix, a $T^2$ value, a chi-square distribution value, a sigma coefficient, or any combination of two or more of the foregoing, is created, constructed, or obtained by a computer.

10. The method of claim 8, wherein a sigma coefficient value from one or more measurement sets exceeds a critical value when the sigma coefficient values for each of two or more out of three consecutive measurement sets or each of four or more out of six consecutive measurement sets or each of six or more out of nine consecutive measurement sets is greater than two.

11. The method of claim 8, wherein a sigma coefficient value from one or more measurement sets exceeds a critical value when the sigma coefficient value for each of two or more out of three consecutive measurement sets is greater than two.

12. The method of claim 11, wherein a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

13. The method of claim 8, wherein a sigma coefficient value from one or more measurement sets exceeds a critical value when the sigma coefficient values for four or more out of five consecutive measurement sets exceed one.

14. The method of claim 13, wherein a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

15. The method of claim 8, wherein a sigma coefficient value from one or more measurement sets exceeds a critical value when the sigma coefficient value for each of fourteen, fifteen, or sixteen consecutive measurement sets is between zero and one.

16. The method of claim 8, wherein a sigma coefficient value from one or more measurement sets exceeds a critical value when the sigma coefficient value for each of fifteen consecutive measurement sets is between zero and one.

17. The method of claim 16, wherein a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

18. The method of claim 8, wherein a sigma coefficient value from one or more measurement sets exceeds a critical value when the sigma coefficient value for each of seven, eight, or nine consecutive measurement sets is greater than one.

19. The method of claim 8, wherein a sigma coefficient value from one or more measurement sets exceeds a critical value when the sigma coefficient values for each of eight consecutive measurement sets is greater than one.

20. The method of claim 19, wherein a measurement vector, a correlation matrix, an autocorrelation matrix, a combined matrix, a $T^2$ value, a chi-square distribution value, a figure of merit, or any combination of two or more of the foregoing, is created, constructed, or obtained by a computer.

* * * * *